(12) United States Patent
Voldman

(10) Patent No.: US 6,526,548 B1
(45) Date of Patent: Feb. 25, 2003

(54) METHOD FOR EVALUATING CIRCUIT DESIGN FOR ESD ELECTROSTATIC DISCHARGE ROBUSTNESS

(75) Inventor: Steven H. Voldman, South Burlington, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/360,397

(22) Filed: Jul. 23, 1999

(51) Int. Cl.⁷ .............................................. G06F 17/50
(52) U.S. Cl. .......................................................... 716/5
(58) Field of Search ............................................. 716/5

(56) References Cited

U.S. PATENT DOCUMENTS

| | | | | |
|---|---|---|---|---|
| 4,742,471 A | | 5/1988 | Yoffa et al. .................. 364/491 |
| 5,225,993 A | | 7/1993 | Iwatsuki et al. ............. 364/490 |
| 5,231,590 A | | 7/1993 | Kumar et al. ................ 364/491 |
| 5,383,132 A | * | 1/1995 | Shinohara et al. ........... 364/491 |
| 5,416,722 A | | 5/1995 | Edwards ....................... 364/491 |
| 5,610,429 A | * | 3/1997 | Crafts ........................... 257/288 |
| 5,675,260 A | * | 10/1997 | Consiglio ................. 324/158.1 |
| 5,696,693 A | | 12/1997 | Aubel et al. ................. 364/498 |
| 5,712,794 A | | 1/1998 | Hong .......................... 364/491 |
| 5,754,826 A | | 5/1998 | Gamal et al. ................ 395/500 |
| 5,801,421 A | * | 9/1998 | Sher et al. .................... 257/355 |
| 5,991,702 A | * | 11/1999 | Saito ........................... 382/224 |
| 6,086,627 A | * | 7/2000 | Bass et al. ....................... 716/5 |

* cited by examiner

Primary Examiner—John F. Niebling
Assistant Examiner—Stacy A Whitmore
(74) Attorney, Agent, or Firm—Connolly, Bove, Lodge & Hutz LLP

(57) ABSTRACT

A method for evaluating a circuit design for electrostatic discharge (ESD) robustness of an integrated circuit design. The design data file is evaluated based upon significant rules which predict ESD robustness for the ESD network or I/O driver network of an integrated circuit. The method is based upon the relative symmetry of the shapes which comprise the ESD or I/O driver network. Using the various rules, the respective symmetries can be determined and compared with a criteria establishing a standard of ESD robustness. The rule is applied to each level of the device, and where symmetry is found to be below the standard of ESD robustness, design failure is determined. When the symmetries are within the criteria, the design is accepted.

17 Claims, 18 Drawing Sheets

Isolation Level

Consistent with ESD shape

Example Mosfet

○ Symmetrical contacts

○ Symmetrical finger length

○ Symmetrical polysilicon level $W = W_1 = W_2$

Example Mosfet

○ Assymetric finger width

○ Assymetric $W_2 > W_1$

Parallel / Antiparallel Current Flow $$\frac{\vec{I}}{|\vec{I}|} = -\frac{\vec{O}}{|\vec{O}|}$$

Vector Normal in Opposite Directions
(Good Implementation)

Parallel / Antiparallel Current Flow

Vector Normal in Same Directions
(Bad Implementation)

Mosfet multifinger design

Mosfet with L-substrate contact

Mosfet

Good Design

Good Design

Mosfet with good substrate ring or parallel design

Mosfet with C-shape substrate contact

METHOD FOR EVALUATING CIRCUIT DESIGN FOR ESD ELECTROSTATIC DISCHARGE ROBUSTNESS

BACKGROUND OF THE INVENTION

The present invention relates to a method for designing integrated circuits which minimizes the effects of high current transients on electrostatic discharge (ESD) circuits and I/O circuits of an integrated circuit. Specifically, the method provides a heuristic method for evaluating circuit designs for their survivability prior to implementation in silicon.

As part of the process of designing integrated circuits to have a high tolerance for electrostatic discharge, and other transient current conditions which may occur on connections of an integrated circuit, each connection may be provided with an ESD protection network. The ESD network is implemented to reduce the probability of damage due to high current conditions, such as are experienced during an ESD event or electrical overstress (EOS) when the current into a circuit device may approach multiple amperes, rather than the usual operating milliampere level. These events can produce a local current, which because of the $I^2R$ effects, result in a second breakdown of a MOSFET device on the integrated circuit due to electrothermal overload. The MOSFET devices within an ESD network may under these circumstances suffer from source and drain failures, due to the thermal breakdown.

A similar result can be experienced in the driver circuits for the integrated circuit, due to abnormally high current conditions on an I/O output. It is, therefore, desirable to evaluate a circuit design, prior to implementing in silicon, and even prior to preparing the photo masks for creating the circuit in silicon.

Modern integrated circuit design is accomplished using various tools which permit the devices to be represented by shapes which are created in the photo masks. The masks create multiple levels which define the ESD devices and I/O output drivers. The present invention provides a way for checking the design of ESD networks and I/O output driver circuits to evaluate their ESD robustness from the file of data which defines the shapes of devices created by the masks for fabricating the circuit in silicon.

SUMMARY OF THE INVENTION

It is an object of this invention to provide a method for evaluating the robustness of integrated circuits.

These and other objects of the invention are provided by a method which evaluates on a level-by-level basis, the robustness of an ESD network or an I/O driver. The method incorporates various heuristic evaluations of the circuit design which, through experience, indicates the capability of the circuit to distribute power during an ESD event, or other high current event, without damage to the device.

The method provides for evaluating the degree of design symmetry of the proposed semiconductor device, by considering various topological features of the design such as the directional flow of current into and out of the device, circuit element design symmetry, contact symmetry, and other design features which reduce the robustness of an ESD protection network, or I/O output device, to transient high current conditions. The semiconductor design is checked before implementing in silicon by evaluating each ESD shape and I/O shape containing an ESD or I/O device to identify any structure which produces a nonuniform power distribution in the event of a high current condition to evaluate the robustness of the device. Each of the ESD production networks and I/O drivers planned for the device are evaluated on a level-by-level basis. In the event that any level fails the check, the level can be redesigned before implementing in silicon.

DESCRIPTION OF THE PREFERRED EMBODIMENT

Integrated circuits are produced from silicon substrates which are the subject of numerous mask operations. The masks create from lines and shapes individual devices on the layers of the integrated circuits. Before manufacturing the integrated circuit in silicon, the data file which defines the lines and shapes of each mask is available for evaluating the design to be implemented in silicon.

One of the criteria for evaluating the design is the ESD robustness. The integrated circuit design includes an ESD network connected to the external contacts of the integrated circuit which dissipates a pulse event, such as a static discharge, so as to avoid damage to the integrated circuit. The capability of the ESD network to dissipate high current pulse events is directly related to the network's topology. The more uniform the current distribution is through the ESD network during a discharge, the greater the robustness of the circuit design.

The distribution of current during an ESD event is dependent upon the design symmetry of the ESD network and its components. To the degree that the design of the ESD network on all levels of the integrated circuit departs from a symmetric configuration about the axes of an ESD network, the greater is the current localized or nonuniformities in the ESD network. If the localized current increases significantly, the heating from $I^2R$ effects of a MOSFET within the ESD network produces a second breakdown condition as a result of thermal overload.

The same effects of an ESD event on an ESD network can be observed in I/O driver circuits connected to an outgoing conductor of the integrated circuit. In both the ESD network and I/O driver circuit, an evaluation of the power distribution of an ESD event within the circuit is an indicator of the robustness of the integrated circuit. The present invention makes a heuristic determination of the power distribution based upon the circuit topology and the configuration of devices within an ESD network or I/O network.

Figure 1:
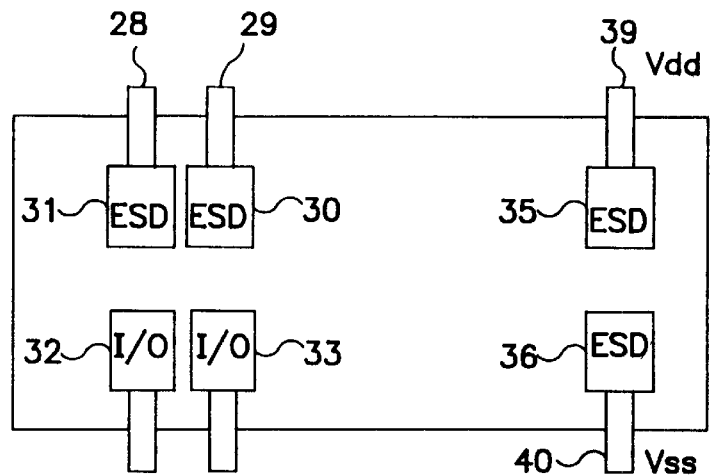
FIG. 1 illustrates the plan view of an integrated circuit design showing the ESD and I/O networks which are to be protected from ESD events.

FIG. 1 represents the plain view of an integrated circuit with various shapes 30, 31, 35 and 36, representing the boundaries of an ESD network. The topology of the devices within these ESD shapes may be evaluated in accordance with a set of rules which predict the robustness of the ESD network.

Figure 2:
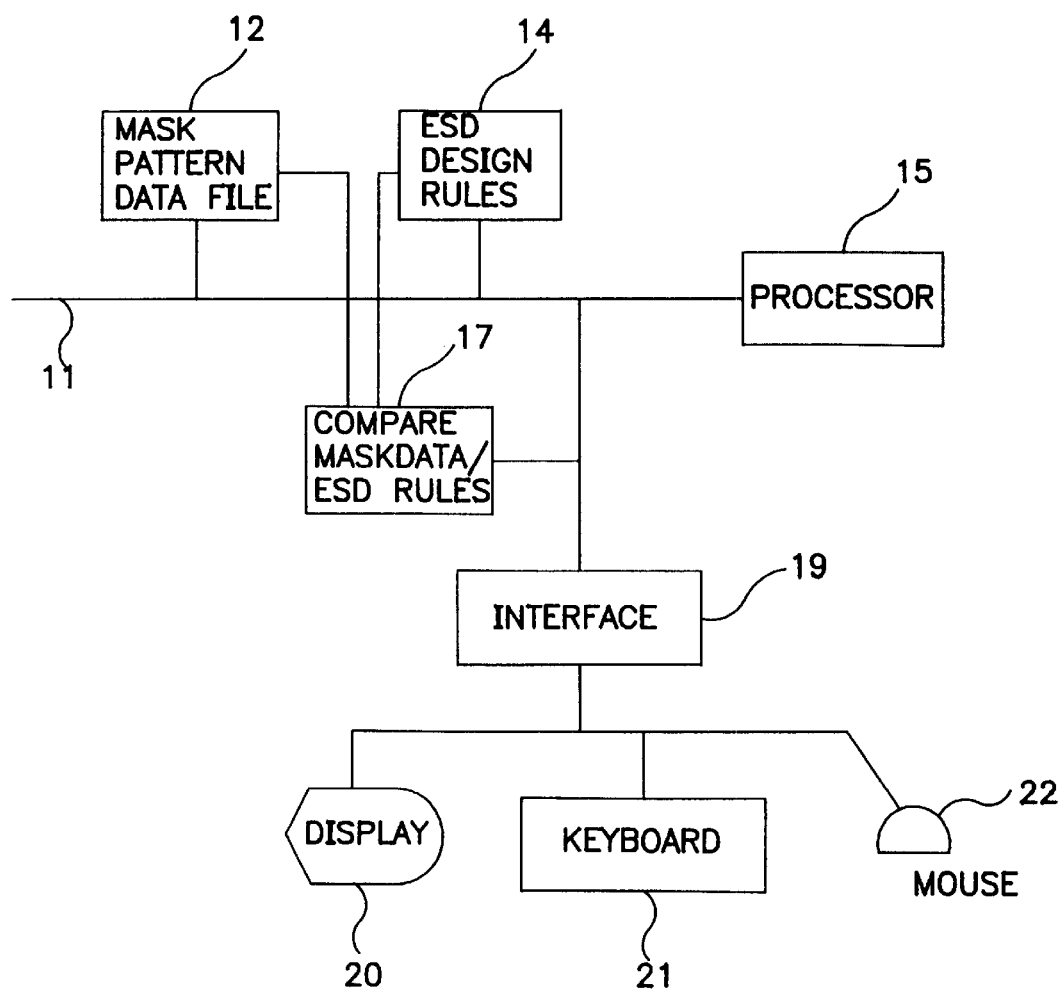
FIG. 2 illustrates the system which generates mask pattern data for creating masks etching a circuit in silicon.

The design system of FIG. 2 represents the conventional architecture of a CAD system for designing the integrated circuit. An operator using keyboard 21 and mouse 22 is able to create the logic which is to be implemented in the integrated circuit. Processor 15 under the control of a stored program creates each of the levels of the integrated circuit. The display 20 permits the observation of each level of the design as it progresses.

Accordingly, an ESD design rule file 14 may be provided in memory storage of the design system of FIG. 2, containing the various criteria for evaluating either an ESD network within an ESD shape, or an input/output driver circuit which are likely to be subject to an ESD pulse event. The mask pattern data file 12 created by the design system containing the lines and shapes to create each level of the integrated circuit, may be compared in a software implemented COMPARE process 17, under control of processor 15, with the contents of the design rule file 14. The result of the comparison of the mask data to the ESD design rules identifies any ESD network design or I/O driver design which does not have the acceptable level of robustness or survivability to an ESD event. The design rule file 14 and instructions for processor 19 for carrying out the process may be stored on a conventional floppy disk or optical disk and loaded into the system memory of the CAD system.

The criteria for implementing the ESD design rule is file 14 is based upon various heuristic criteria which is known to produce a robust network which can sustain an ESD pulse event. One of the more significant criteria in evaluating the ESD robustness is the symmetry of the components within the ESD shape. This symmetry can be defined more quantitatively for a given level as the placement of circuit components with respect to first and second axes of the ESD shape or I/O driver shape. Specifically, on a per-level basis, the following criteria represents the ESD robustness of a given network:

1. for each level of the integrated circuit the symmetry of components about the shape axes;
2. the direction of current flow into and out of an ESD or I/O driver shape;
3. the relative distribution of contacts on a metallization layer of the integrated circuit;
4. the symmetry of each MOSFET element within an ESD shape;
5. the orientation of a substrate contact within the ESD network;
6. the variation in centroids of each shape on a level of the integrated circuit.

Figure 3:
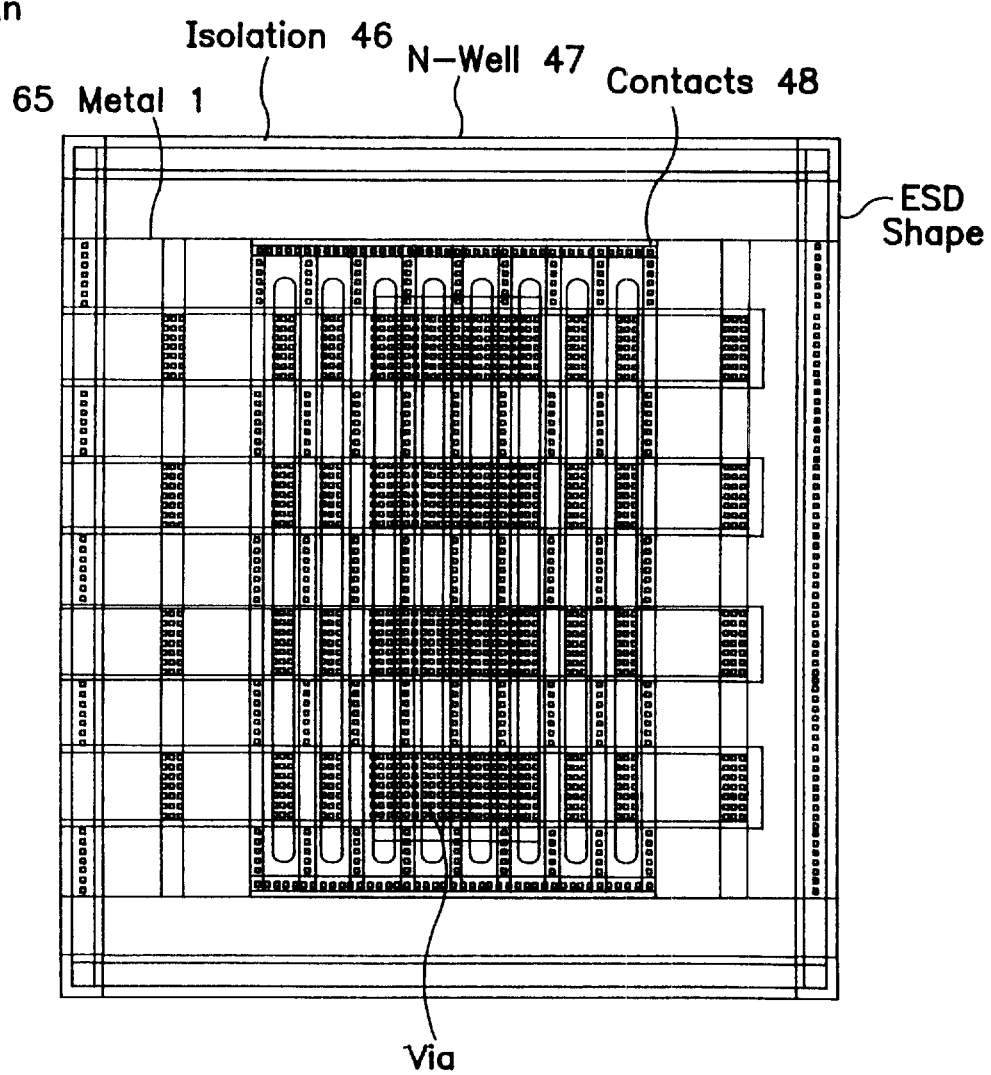
FIG. 3 illustrates a top view of the resulting silicon within an ESD shape produced from the masks created by the system of FIG. 2.
Figure 4:
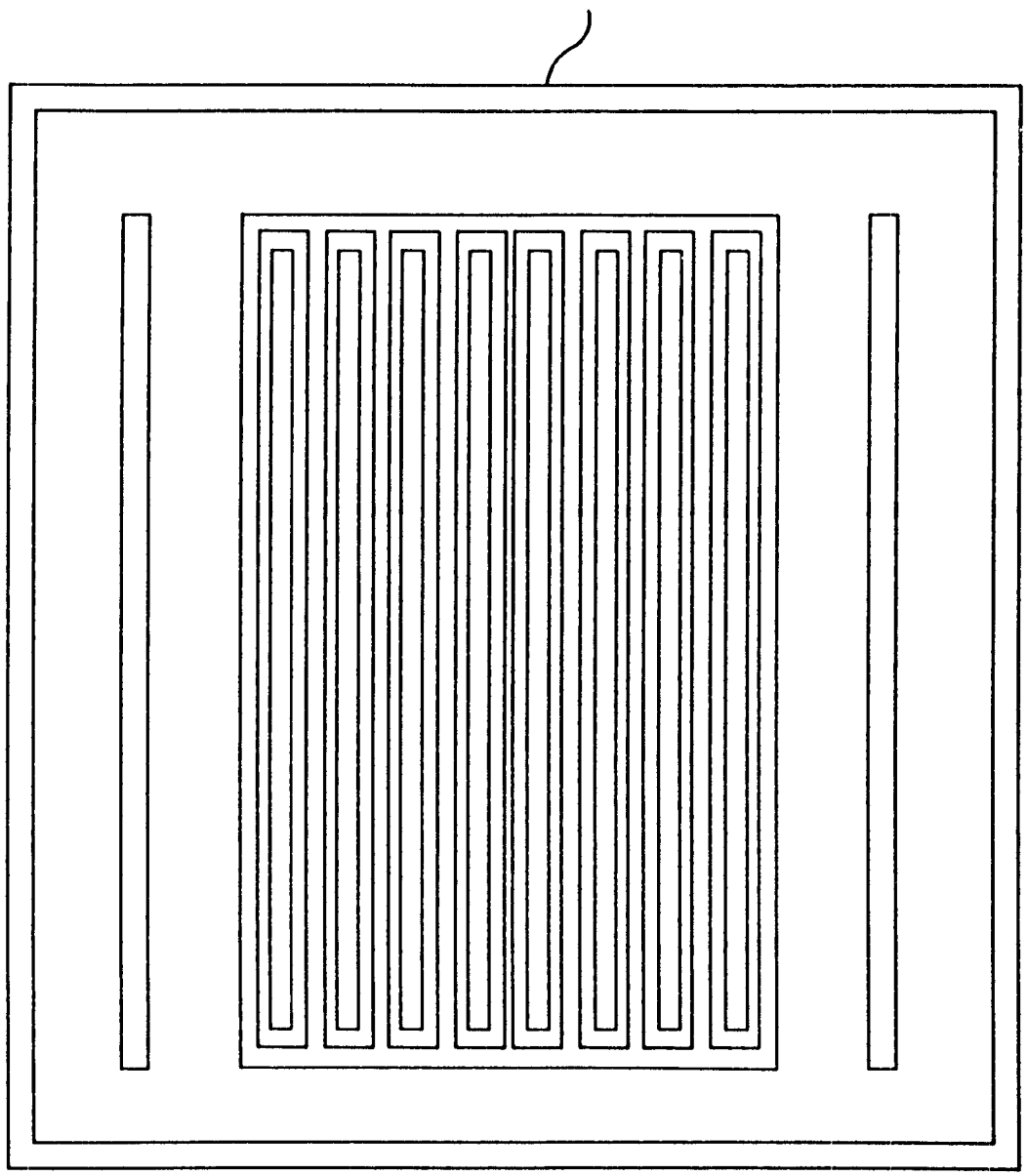
FIG. 4 shows an isolation level of the integrated circuit within an ESD shape.

FIG. 3 illustrates an example of an ESD network defined by the mask pattern data file having an ESD shape on a dummy level of the integrated circuit. The ESD shape includes for all levels of the integrated circuit those elements which distribute the power from an ESD pulse event. The multiple levels include a metallization layer 45, an isolation layer 46, an N-well layer 47, a contact layer 48, and a via layer 49 connecting the metallization layers. The robustness of the components within the ESD shape is evaluated for each of the layers according to the ESD design rules.

FIGS. 4–8 illustrate the multiple layers within the ESD shape containing components which are evaluated for symmetry. The symmetry of each component is evaluated about the X and Y axes of the ESD shape. As a first criteria for evaluating the symmetry of the components within the ESD shape (or alternatively, an I/O driver shape), a calculation of the moment of inertia of such component is made about the axes X, Y. The power distribution of each component within a level of an ESD shape can be defined in terms of the moment of inertia, representing the physical distance from the axes as an indication of symmetry. Each level is checked, vis-a-vis the moment of inertia, and if any one level has a moment of inertia exceeding a predetermined level, the design is deemed unacceptable.

Figure 5:
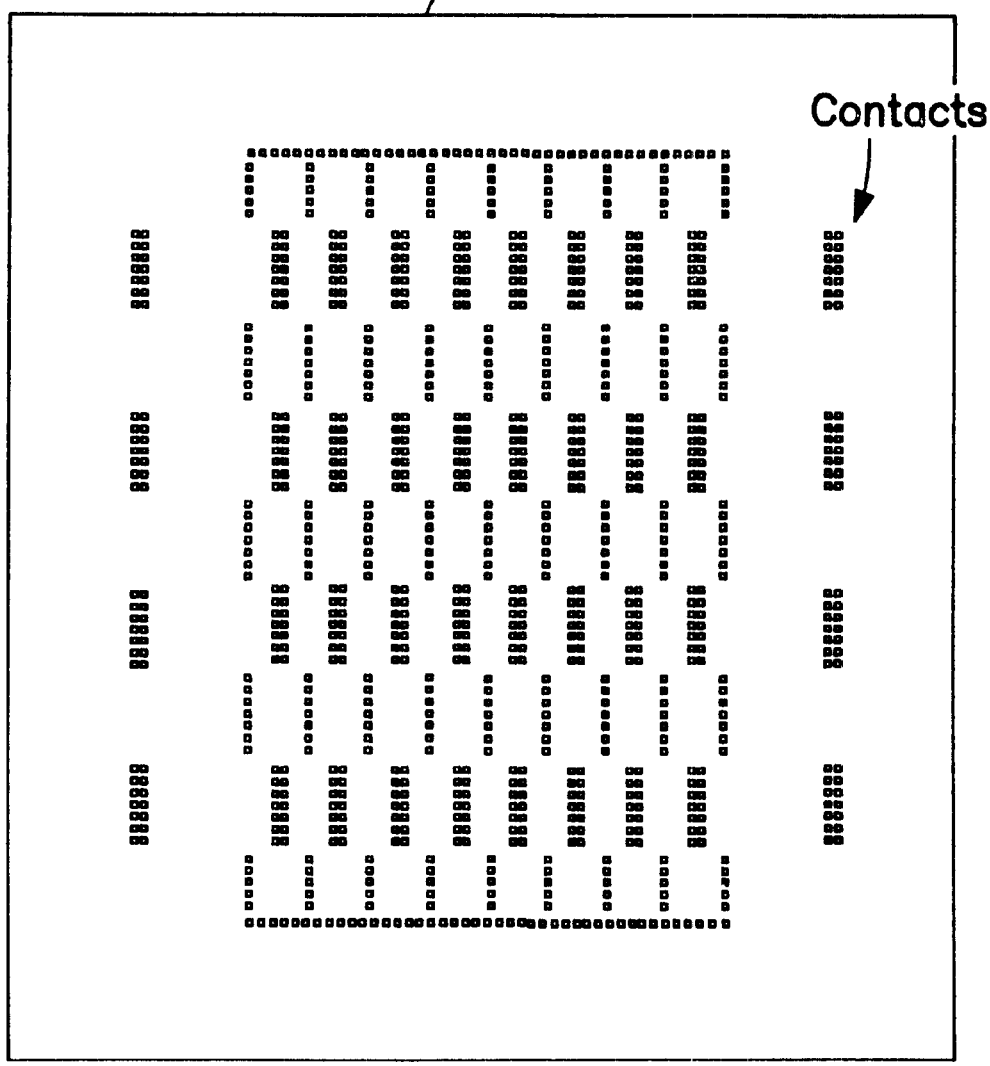
FIG. 5 shows the contact level for the integrated circuit within the ESD shape.
Figure 6:
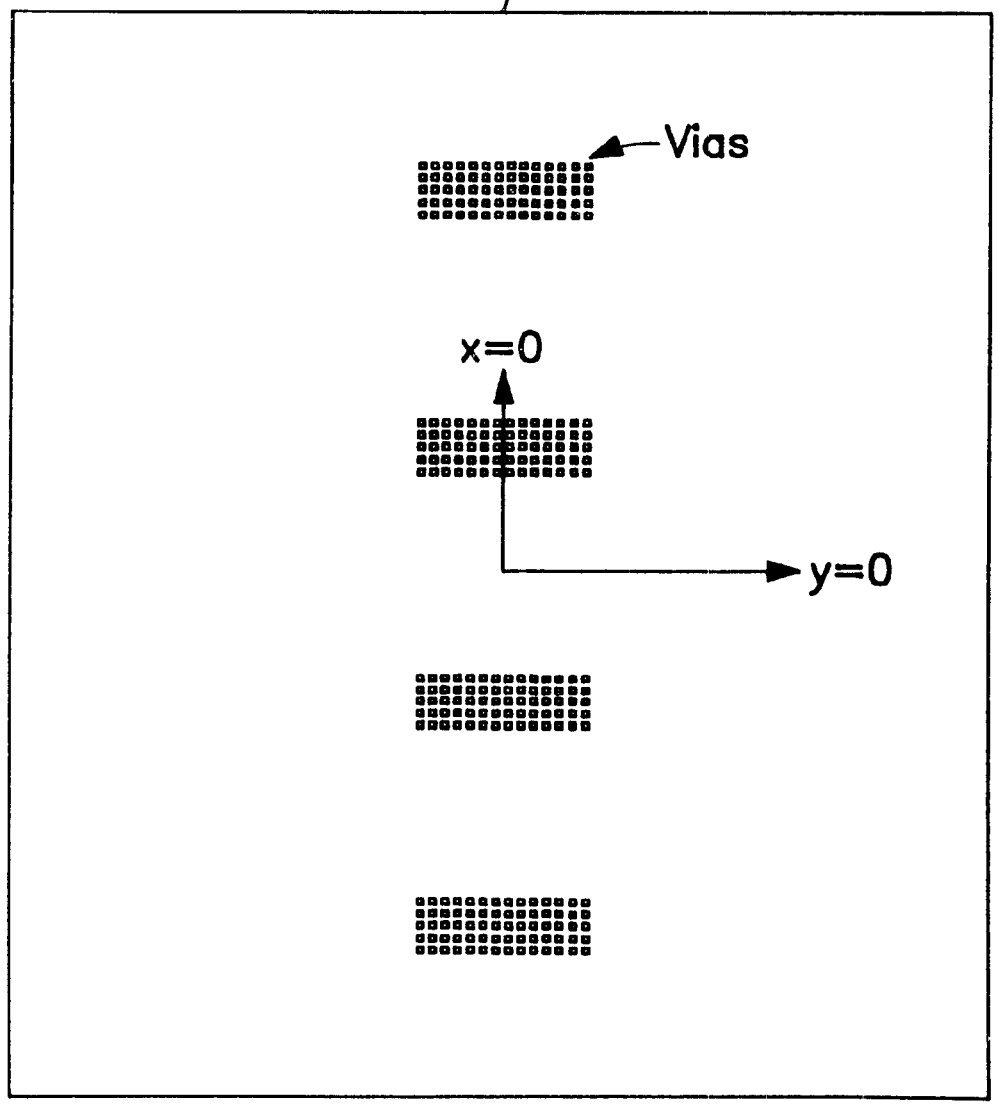
FIG. 6 shows the via level for the integrated circuit within the boundaries of the ESD shape.
Figure 7:
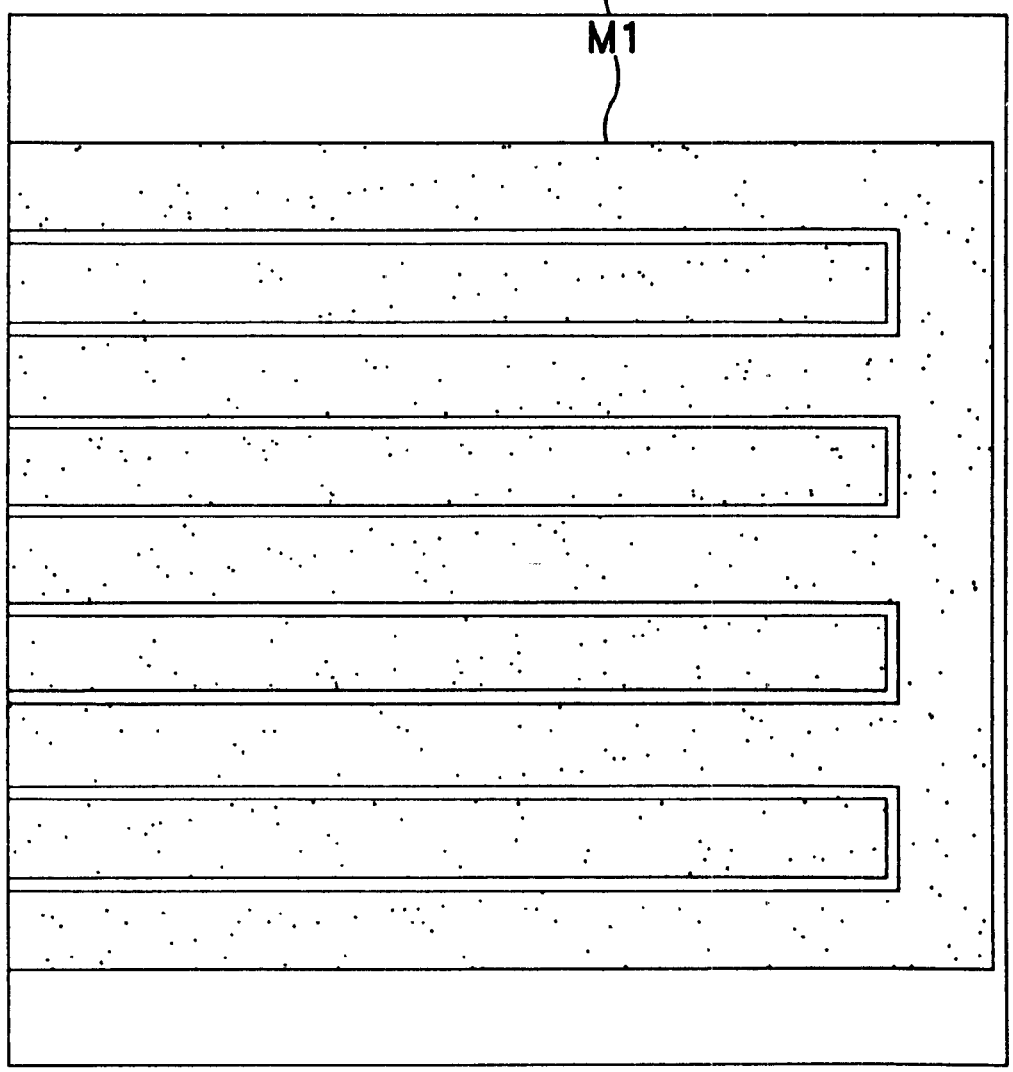
FIG. 7 illustrates the metallization level for the designed integrated circuit within the ESD shape.
Figure 8:
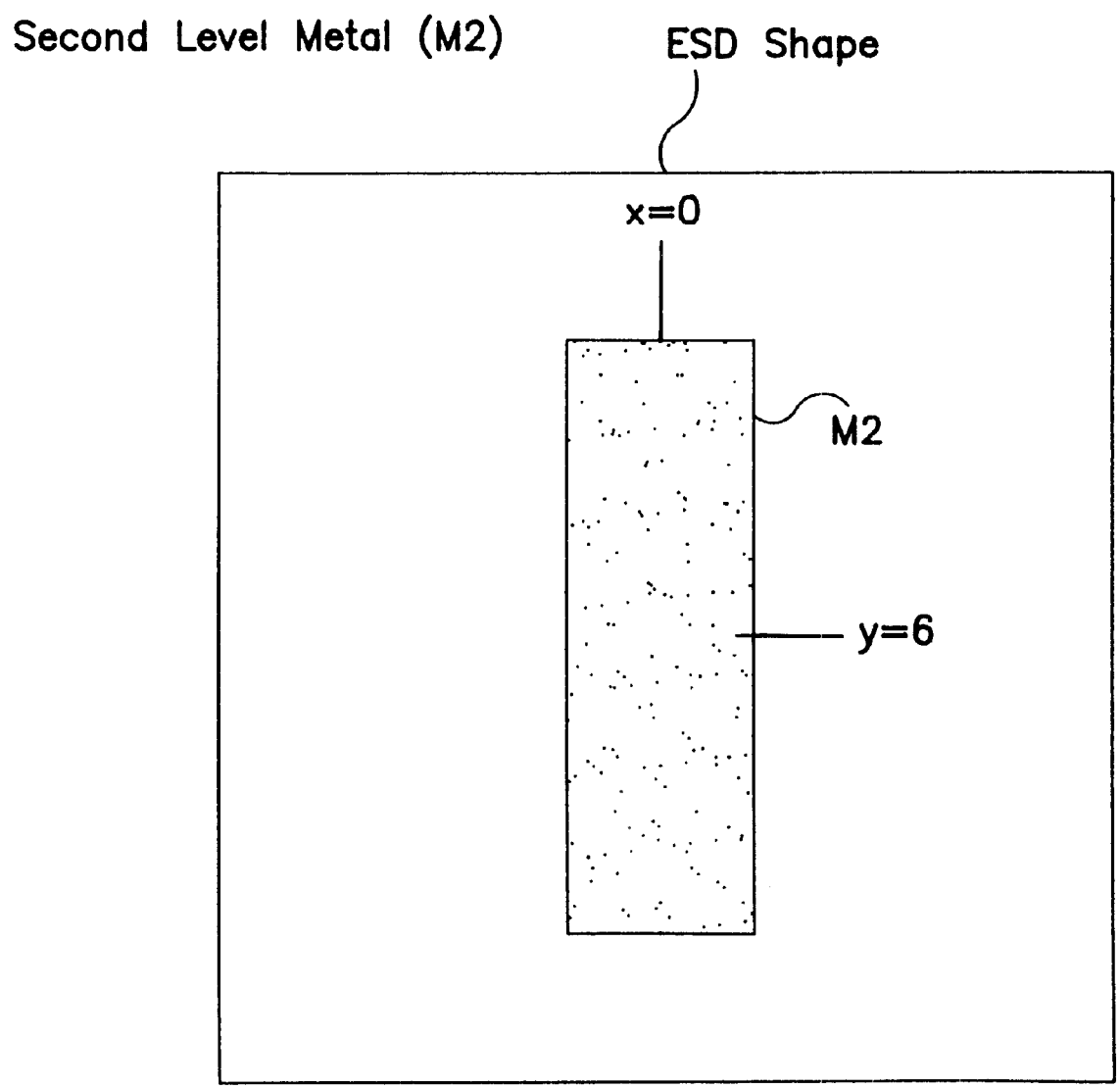
FIG. 8 illustrates a second metallization level (M2) within the ESD shape.

A similar analysis is applied to a contact level of FIG. 5 and the via level of FIG. 6. If the contacts or vias are symmetrically distributed about the axes X and Y, a high degree of ESD robustness results. For the contact level of FIG. 5 or via level of FIG. 6, this criteria may be established as the number of contacts or vias which are to the left and right of X=0, and the number of contacts above and below Y=0. If the contact count on each side of the respective axes is within 90°, the level may be deemed as having an acceptable symmetry and ESD robustness.

Figure 11:
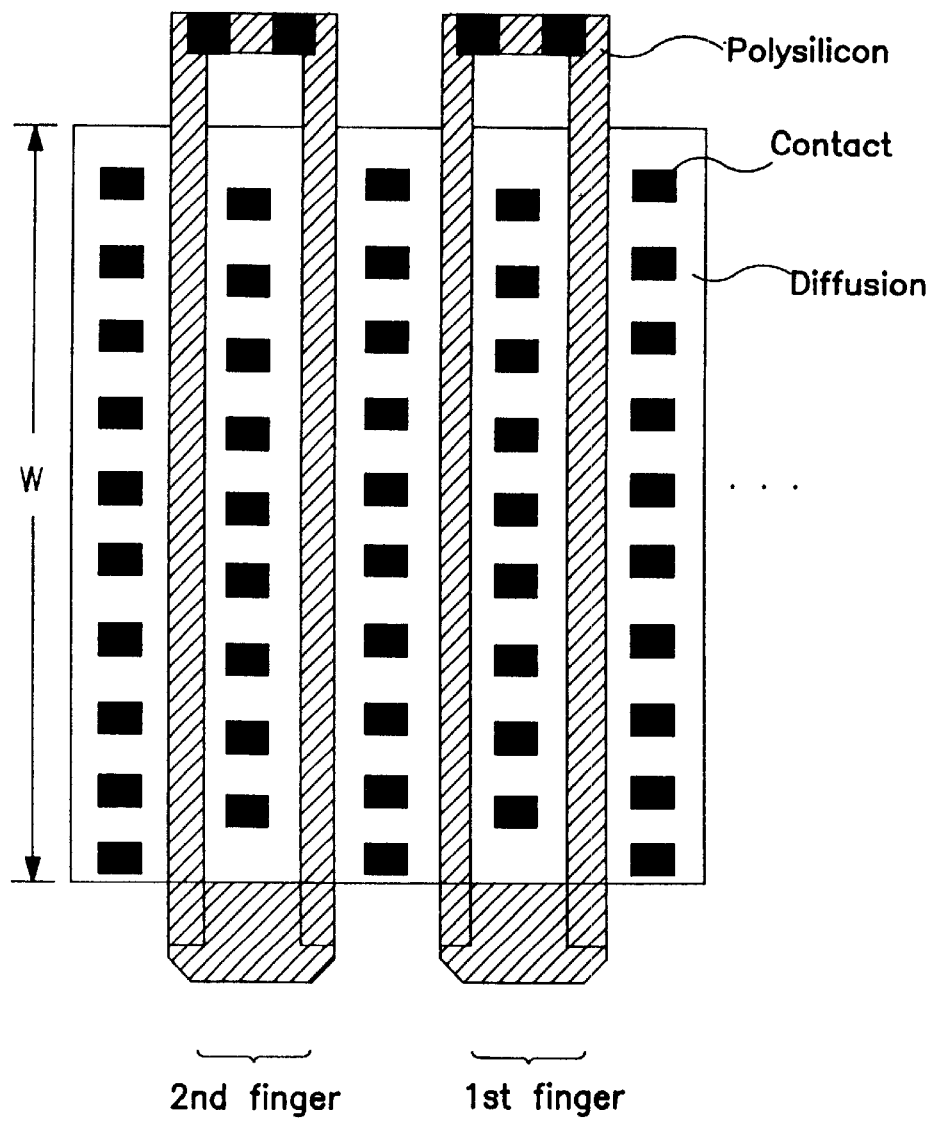
FIG. 11 illustrates a symmetric multifinger MOSFET device within an ESD shape.
Figure 12:
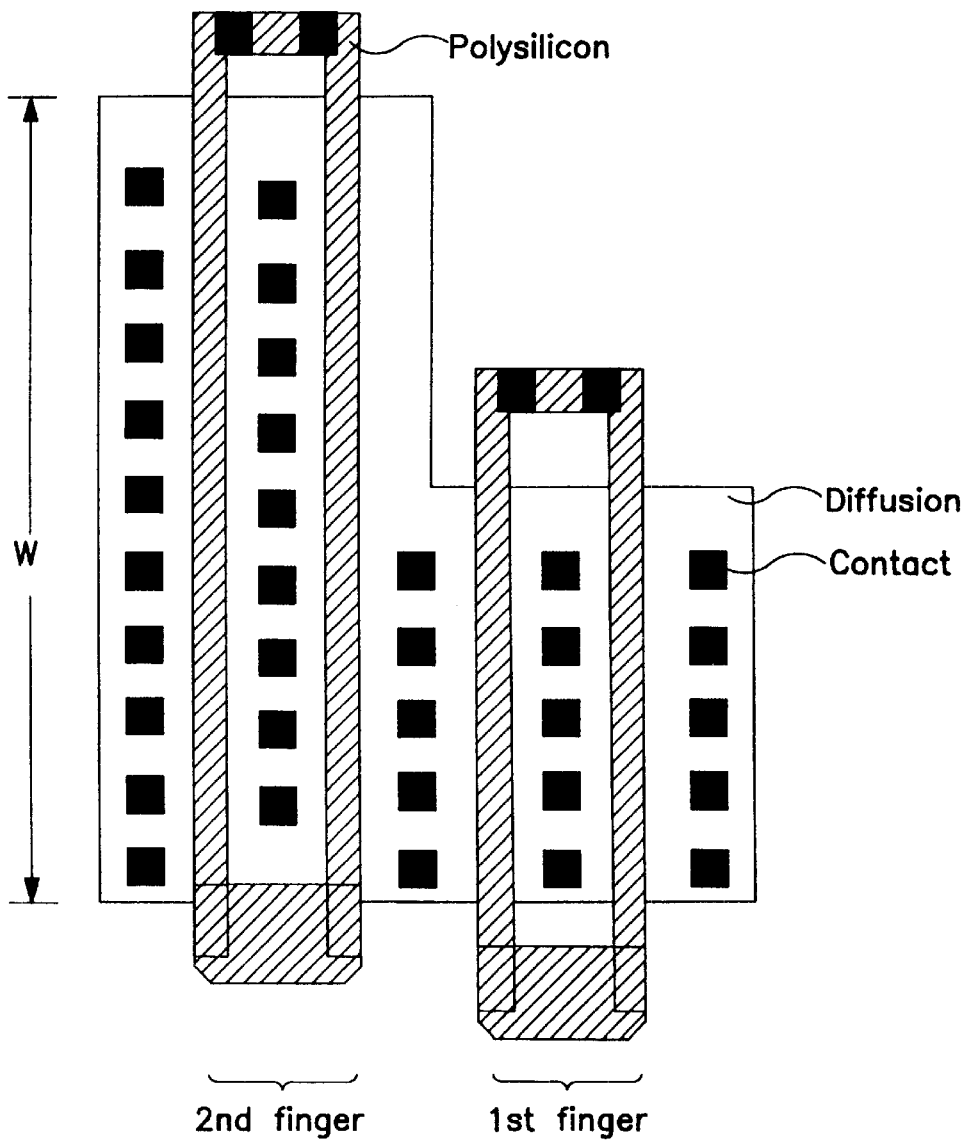
FIG. 12 illustrates a multifinger MOSFET device having an asymmetric shape within an ESD shape.

The symmetry of the MOSFET device is also determinative of the ESD robustness. FIG. 11 illustrates the structure of a multifinger MOSFET having good symmetry, and FIG. 12 illustrates the structure of a multifinger MOSFET having bad symmetry. The MOSFET of FIG. 12 has an asymmetric polysilicon level width and an asymmetric finger width making it an unacceptable design.

As yet another design rule for determining the ESD robustness, a rule may be developed which considers for each level of the integrated circuit, the centroid of all shapes contained within the ESD level.

The first step in the process includes identifying an ESD shape noted on a dummy level of the integrated circuit design. A centroid for the first level i of the ESD shape is defined for the fundamental axes of level i. The first moment of a second level j, relative to i representing the shape times the distance to the axes, is determined. The additional second and third moments of the second moment j relative to level i are defined as the shape times the distance to the axes. The symmetry of the device is evaluated based on the calculated first, second and third moments. The process continues for all levels up to n, which are compared to a determined symmetric and asymmetric criteria defining an acceptable design.

In accordance with another method for evaluating the symmetry for each of the levels, the centroid of each of the components in the ESD shape of the various levels of the ESD network is determined. The alignment of the centroids for each of the levels is determined and from the relative position of the centroids of each level, with respect to each other a determination of the relative symmetry between levels is obtained. the relative alignment of the centroids is compared with a predetermined alignment to determine whether the design is acceptable.

The centroids for the remaining levels of the ESD shape are also determined, and their position is similarly compared with the centroids of the previous layers. The result corresponds to a summation of each of the centroid positions, which gives an overall evaluation of the device symmetry along the Z axis. If the resulting symmetry between levels is determined to be an acceptable level, such that the alignment error between centroids is less than 10%, the design is deemed to be acceptable.

Figure 15:
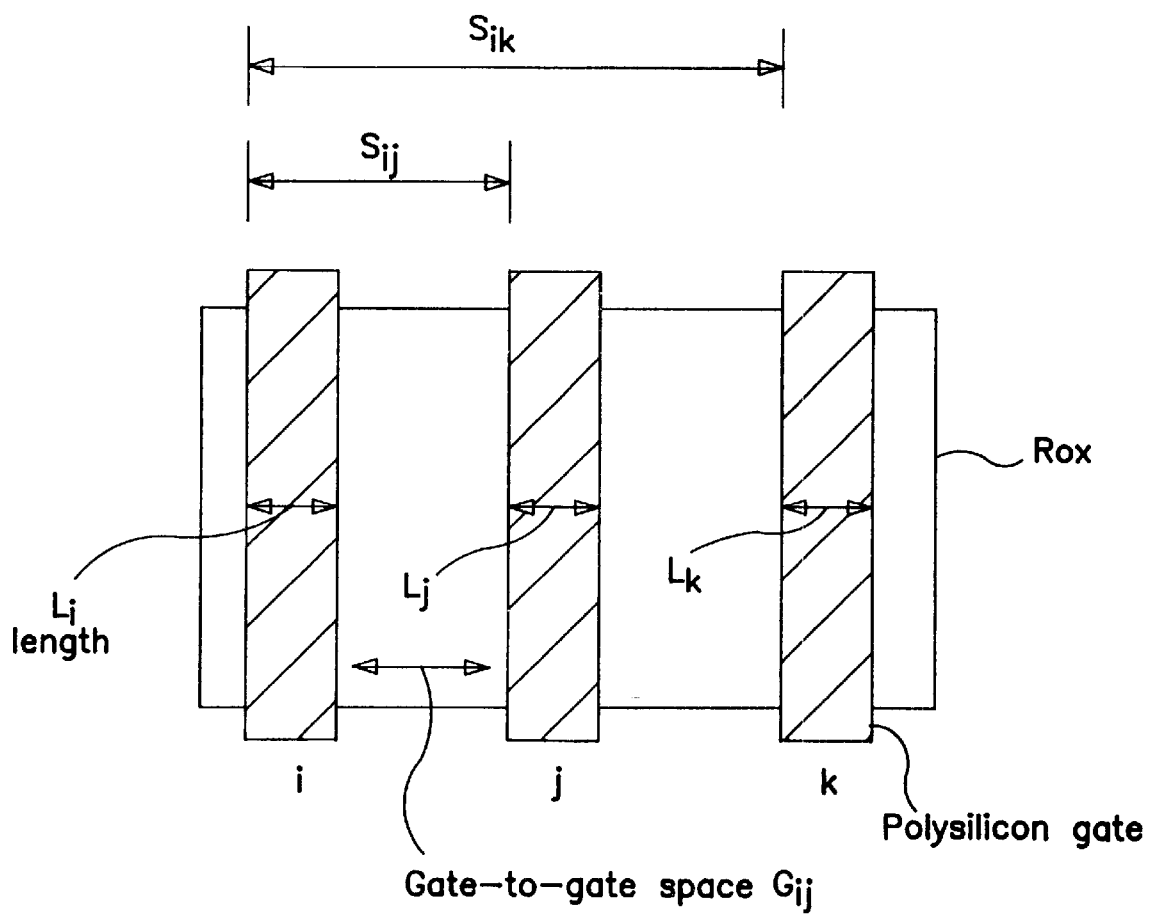
FIG. 15 is a plan view of a multifinger MOSFET device illustrating the effects of gate-to-gate spacing on EST robustness.

Other rules for determining the ESD robustness evaluate the design symmetry of individual shapes of the ESD network or I/O driver on the masks, such as the line/space pattern representing the gate-to-gate space of $G_{ij}$ adjacent MOSFET devices within the ESD shape. Having a uniform line/space conformity $S_{ij}$ shown in FIG. 15, for the polysilicon gates i, j and k, leads to a uniform MOSFET breakdown in a multi-finger MOSFET ESD network. A rule for implementing a determination of the robustness based on the line/space conformity as follows:

The ESD network is identified from an ESD shape appearing on the integrated circuit level. A first line, second line and third line, i, j and k, are determined, and the distance between i and j, representing the length between an edge i and j, is defined as the length L (i,j). The distance between i and j is again evaluated, and the space is the distance between the edge j and k, defined as the space S (j,k). The process is continued for all shapes contained within the ESD shape, such that a set of L lengths and S spaces are determined for each shape within the ESD network. The symmetry is evaluated from the variations in L for any i and j, the variations of S for any i and j, as well as the variations in L-S for any i and j. If these variations meet an established criteria, the device is determined to have symmetry for the given level. The process is repeated for all levels, and if any level fails to meet the criteria the ESD design is deemed unacceptable.

Figure 13:
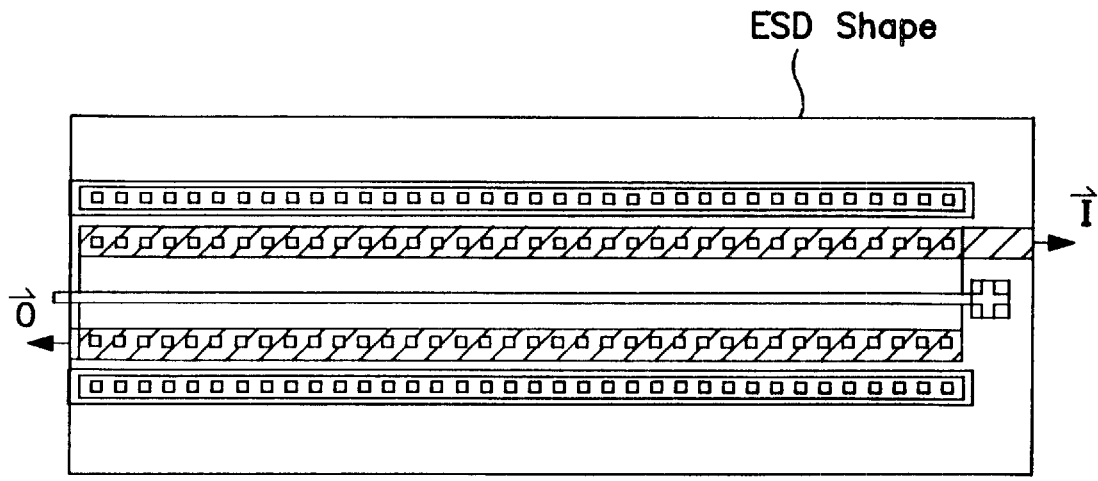
FIG. 13 illustrates the example of a current flow into and out of an ESD shape, representing an acceptable ESD design.

A rule based upon the current flow into and out of devices within the ESD shape is also used as an effective criteria for measuring ESD robustness. Generally, if the current enters a device within the ESD shape such as a MOSFET, from the source, and leaves through a chain in a direction 180° to the entering current as shown in FIG. 13, the ESD results are deemed optimal for the structure. The consequence of a current flow into a device which is opposite to the flow of current out for the device provides full utilization of the entire width of the MOSFET structure.

Figure 14:
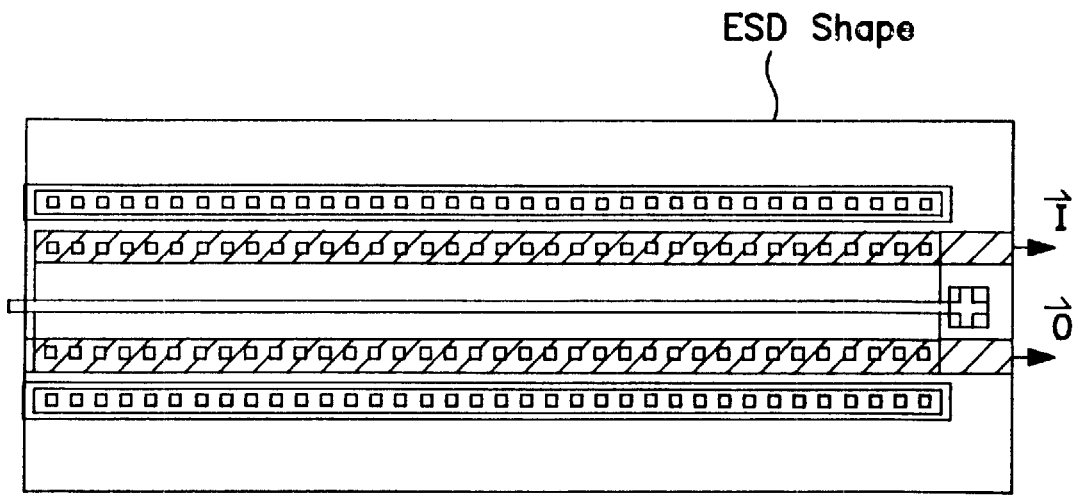
FIG. 14 shows a current flow within an ESD shape representing an unacceptable design.

On the contrary, if current enters the device on the left, through the source, and leaves to the drain, to the left of the device the results are not optimal, but acceptable. If the current enters the device on the left of the source and leaves to the drain to the left, the current vector in and current vector out is in the same direction as shown in the MOSFET of FIG. 14, representing an unacceptable design because the full width of the structure is not available for the dissipation of the ESD pulse. The voltage distribution with a current inflow and outflow results in an uneven voltage distribution more likely to produce a second breakdown of the MOSFET device. Accordingly, one of the rules to be used in the system of FIG. 1 is an evaluation of the respective current flow direction into and out of each device within an ESD shape.

Figure 9:
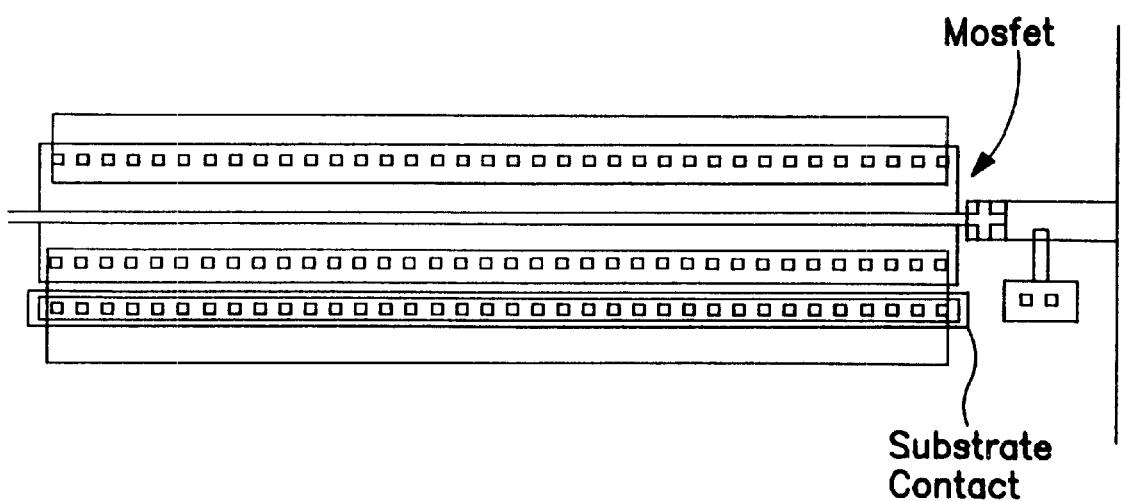
FIG. 9 illustrates a device within the ESD shape having an asymmetric substrate contact.
Figure 10:
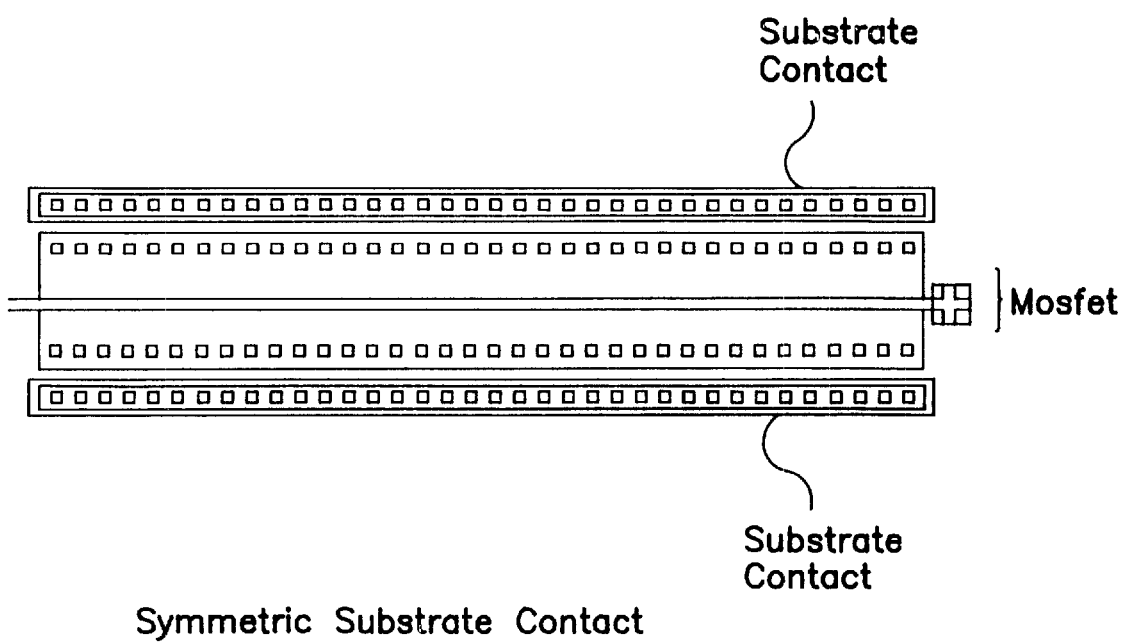
FIG. 10 illustrates a MOSFET within the ESD shape having a symmetric substrate contact.

As another check on ESD robustness, the uniformity of the substrate resistance of a substrate contact on the integrated circuit to all of the different MOSFET finger channels represents a significant indication of ESD robustness. The spatial symmetry and distances of the substrate contact to individual finger of a MOSFET is key to a robust design for the device. Consequently, a methodology which evaluates the resistance between the local contact and a MOSFET finger is useful in predicting the ESD robustness. FIGS. 9 and 10 illustrate an unacceptable design and an acceptable design, respectively.

It has been determined that if the contact is orthogonal to the MOSFET width, this decreases ESD robustness, resulting in an unacceptable design. On the contrary, when the substrate contact is parallel to the width, this produces an optimum substrate resistance from the contact to the different MOSFET finger channels.

The method for evaluating the resistance between any local contact i to a MOSFET finger j may be reduced to the following steps.

Figure 16:
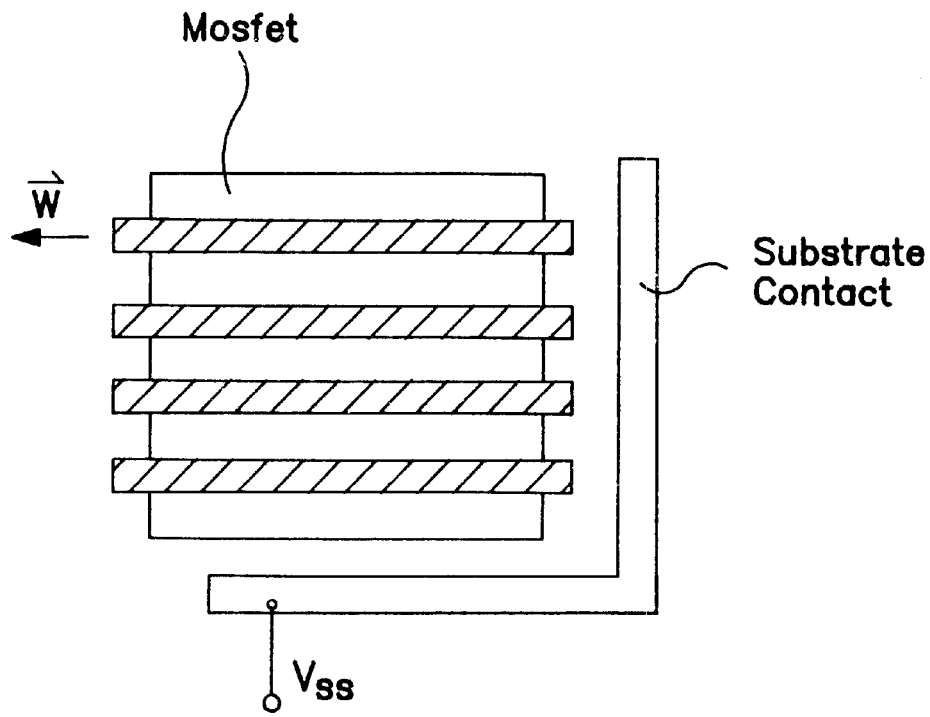
FIG. 16 illustrates an L-shaped substrate contact.
Figure 17:
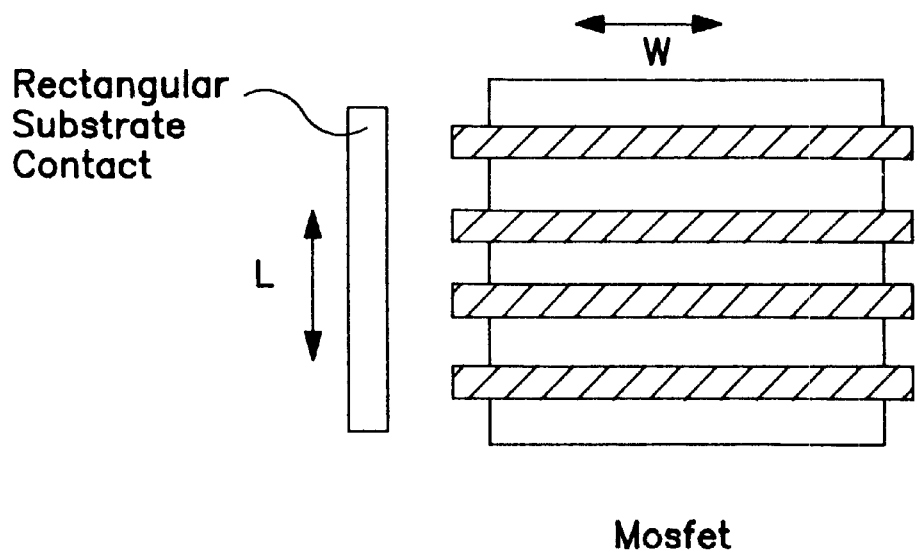
FIG. 17 illustrates a rectangular substrate contact for a multifingered MOSFET device.
Figure 18:
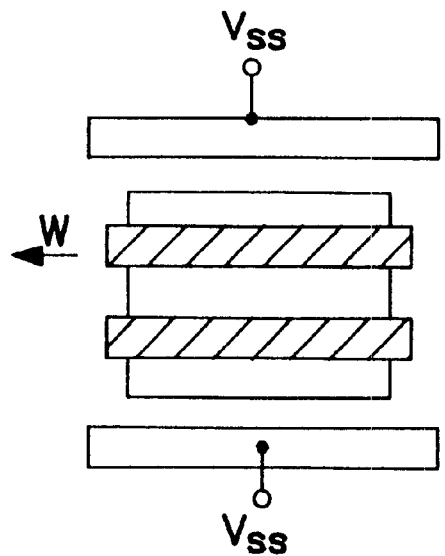
FIG. 18 represents a parallel structure of the substrate contacts with respect to the MOSFET device.
Figure 19:
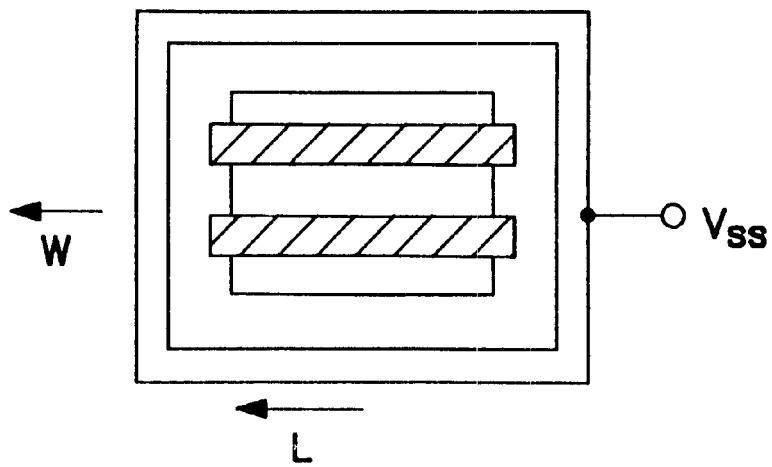
FIG. 19 represents a substrate contact in the shape of a ring.
Figure 20:
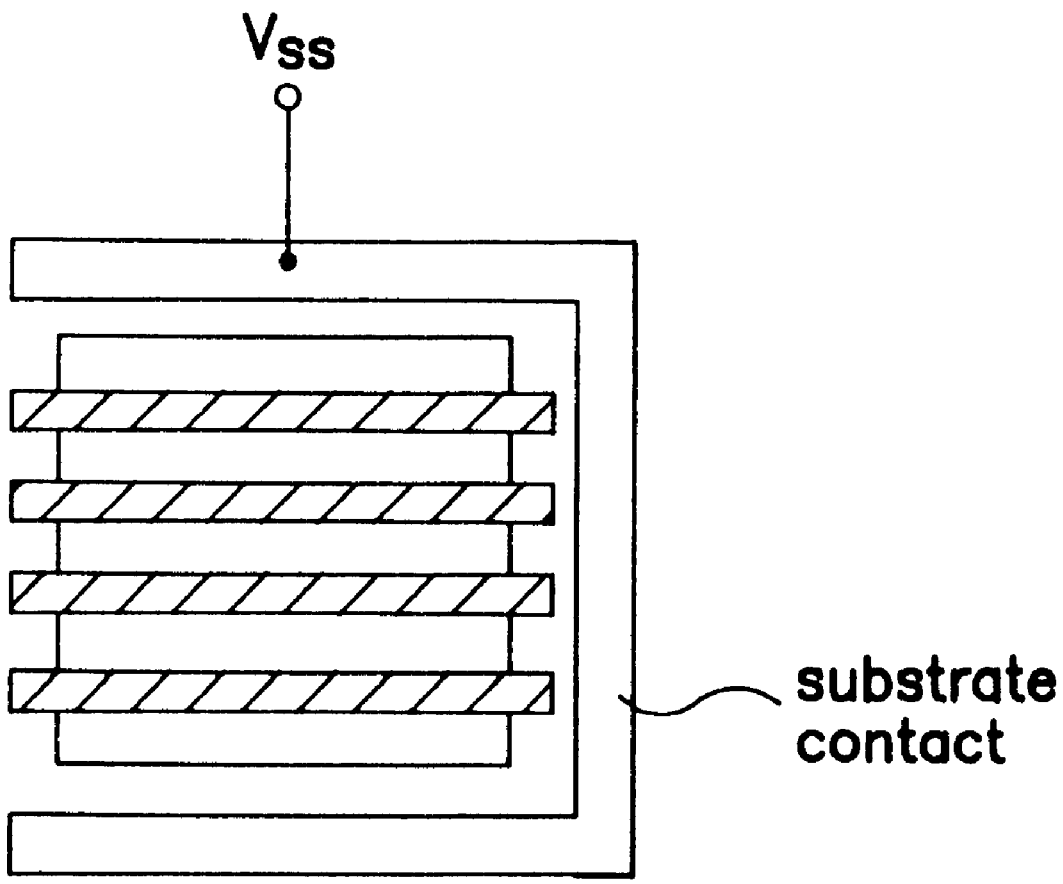
FIG. 20 shows a C-shaped substrate contact for an MOSFET.
Figure 21:
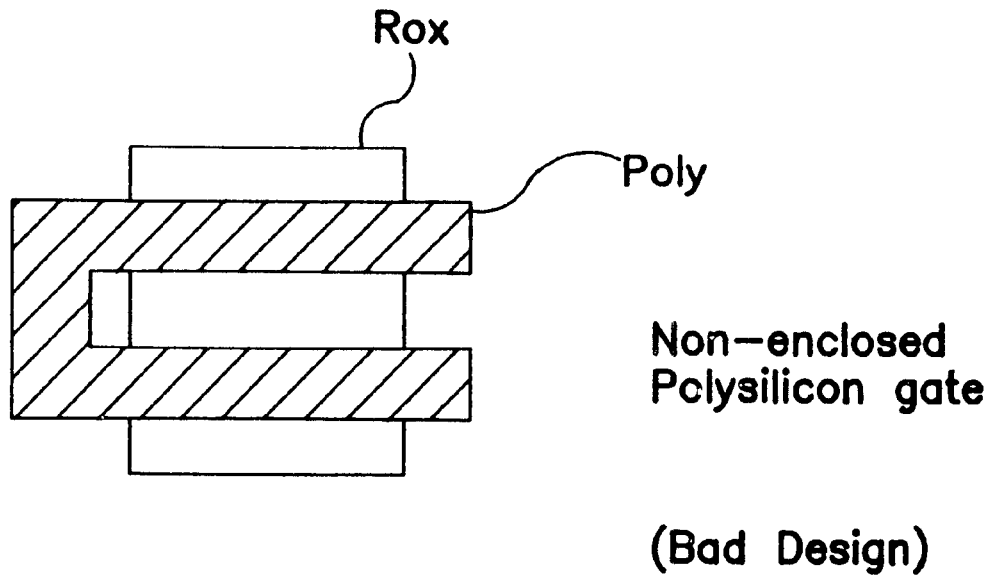
FIG. 21 represents a polysilicon gate which is open at one end.
Figure 22:
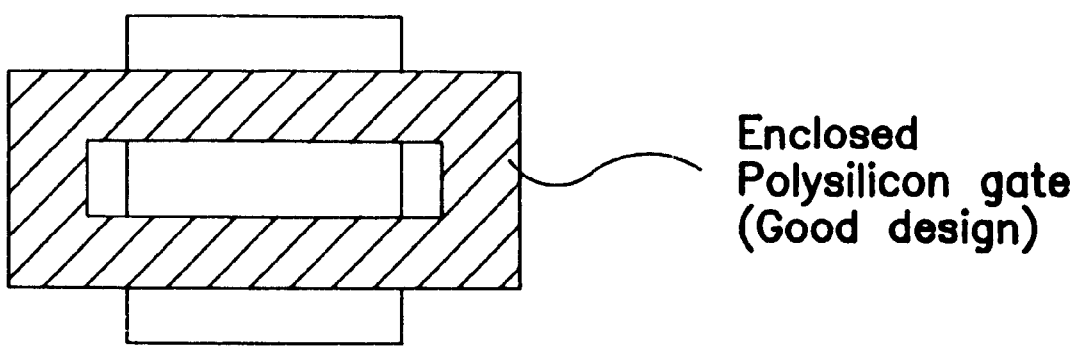
FIG. 22 shows a polysilicon gate which is enclosed.

1. The ESD network with an ESD SHAPE is identified on an ESD dummy level of the integrated circuit. For the STI, or ROX level, the VSS power rail is identified, to locate the substrate contact.
2. The MOSFET width direction within the ESD shape is identified.
3. The substrate contact is determined as either a rectangle adjacent a transistor (FIG. 17), an L shape (FIG. 16), a C shape (FIG. 20) or a ring configuration (FIG. 19).
4. If a rectangle is determined as the shape of the substrate (FIG. 17), a vector L is defined as the direction of the rectangle longer dimension.
5. A vector W is defined in the direction of the MOSFET width.
6. If the vectors L, W are perpendicular, the design fails. If the vectors are parallel, the design passes.
7. If the contact is an L shape (FIG. 16), the design fails.
8. If the contact is a C shape (FIG. 20), the design fails.
9. If the contact is a ring (FIG. 19), the design is acceptable.
10. Where the contact consists of two rectangles, vectors along the longer dimension of each rectangle are determined.
11. If the vectors are perpendicular to MOSFET channel width vector, the design fails. If the vectors are parallel, the design passes.
12. If the substrate contact is parallel to the transistor width (FIG. 18), the design is acceptable.
13. If the polysilicon gate is open, as shown in FIG. 21, this constitutes a poor design.
14. If the polysilicon gate is closed, such as is shown in FIG. 22, the design is considered acceptable.

In another method for implementing a rule based on the substrate resistance calculations from a substrate contact to all points within the MOSFET structure, the following method may be applied.

1. The ESD network is identified from the ESD shape on the dummy level.
2. For STI or ROX level, of the integrated circuit. within the ESD shape, a power rail is identified for locating the substrate contact.
3. The circuit element connected to a PAD which is an N channel MOSFET is identified, and the spacing from the substrate contact to the channel positions of the N channel MOSFET are determined.
4. The resistance value to all points on the MOSFET is calculated between the substrate contact and channel positions.
5. The resistance calculation is determined as a criteria for acceptability and the design is either acceptable or not based on the variation in resistance, representing a resistance symmetry.

A rule can be developed based upon the existence of a multi-finger MOSFET within the ESD space. Using a closed edge on all sides of a finger MOSFET reduces the polysilicon resistance along the MOSFET channel. If the resistance exceeds some constraint, then a failure may be declared. To implement the foregoing rule, the following steps may be selected.

1. The ESD network is identified in the ESD shape.
2. Polysilicon film level for the ESD shape is identified.
3. The ROX level is also identified.
4. Each of the MOSFETs within the ESD shape are identified.
5. The resistance of each polyfinger of each MOSFET along the channel from the comb connection, or from the connection to the polyshape is determined. If the resistance exceeds a criteria determined with respect to the particular ESD robustness standard, the device design is considered to fail.

The rule may also embody a second method for evaluating the resistance along the finger of the MOSFET gate. If the resistance exceeds some level, the device is considered to be a failure. This method may be implemented with the following steps.

1. The ESD network with an ESD shape is defined on the dummy level.
2. The polysilicon film level is determined.
3. The ROX level is identified.
4. All of the MOSFET fingers are located.
5. If the MOSFET fingers represent a cone structure, 6, resistance of each polyfinger along the channel from the cone connection to the polyshape is evaluated as a criteria for ESD robustness.

As a third option, the method for implementing the rule can be limited to evaluating whether or not the MOSFET device is a cone, or an enclosed MOSFET gate. If it is a cone, it is considered a failure, or it is redesigned to close it on the open side.

Thus, the foregoing rules which are all related to the ESD robustness of the ESD network, or I/O driver network, may be implemented in the design rule file 14. The CAD system of FIG. 2 may then compare each of the resulting structures, identified in the mask pattern data file 12 with the rule set to determine whether or not the design is acceptable from an ESD robustness basis in accordance with a stored program containing instructions for carrying out the method on processor 15. These instructions as well as the design rule file are entered into the system using conventional floppy disk or optical disk storage devices.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A method of evaluating the ESD robustness of an integrated circuit design comprising:
   locating an ESD shape enclosing an ESD network on a plurality of layers of said integrated circuit;
   determining the symmetry of components within said ESD network with respect to first and second axes of each of said layers;
   comparing the determined symmetry of said components with respect to a predetermined level of symmetry; and
   accepting said design when said determined symmetry of each component on each layer is less than said predetermined level.

2. The method according to claim 1 further comprising:
   checking the direction of current flow through said components for each of said layers, and
   accepting said design when said current flow into and out of said components are in opposite directions.

3. The method according to claim 1 further comprising:
   determining the relative distribution of contacts on a metallization layer of said integrated circuit with respect to said axes; and
   accepting said design only when said contacts have a symmetrical distribution about said axes.

4. The method according to claim 3 further comprising:
   determining the relative spacing between each of said contacts; and
   accepting the design when said relative spacings between said contacts are substantially the same.

5. A method for evaluating ESD robustness of an integrated circuit design based on the symmetry of an ESD network comprising:
   identifying an ESD shape on a level of said integrated circuit containing said ESD network;
   determining the centroid of said ESD shape on multiple levels of said integrated circuit;
   determining the offset between said centroid of multiple levels;
   comparing said offset with a predetermined offset; and
   accepting said design when said determined offset is less than said predetermined offset.

6. A method for evaluating BSD robustness of an integrated circuit design comprising:

identifying an BSD shape containing an BSD network on said integrated circuit;

identifying a first axis and centroid of a first level i;

determining the first moment of shapes contained within said ESD shape in a second level j relative to said first level i;

determining a second moment of shapes contained within said ESD shape in said second level j relative to said first level i;

determining a third moment of shapes within said ESD shape in said second level j;

determining from said first, second and third moments the symmetry of said ESD shape; and accepting said design if said symmetry is within a specified degree.

7. The method according to claim 6 further comprising:

determining the first, second and third moments of shapes contained within said ESD shape for all of said levels of said integrated circuit;

determining for each of said levels the symmetry of said shapes in said level based on said first, second, and third moments; and accepting said design if said symmetry of each of said levels is within said specified degree.

8. A method for evaluating the robustness of a computer design of integrated circuits comprising:

determining from computer data defining mask structures an ESD shape on a level of said integrated circuit;

determining for shapes contained within said ESD shape the degree of symmetry of said shapes with respect to first and second axes of said level; and accepting said design based upon said determination of said degree of symmetry.

9. The method for evaluating the robustness of a computer design of integrated circuits according to claim 8 further comprising:

evaluating for each remaining level of said integrated circuit the respective symmetry of each of said shapes contained within an ESD shape; and accepting said design based on a determination of the symmetry of all of said levels.

10. In a system for verifying the design of integrated circuits, a storage medium containing instructions for carrying out a method for evaluating the robustness of the design comprising:

locating an ESD shape enclosing an ESD network on a plurality of layers of said integrated circuit;

determining the symmetry of components within said ESD network with respect to first and second axes of each of said layers;

comparing the determined symmetry of said components with respect to a predetermined level of symmetry; and accepting said design when said determined symmetry of each component on each layer is less than said predetermined level.

11. The storage medium according to claim 6 further comprising the stored instructions of:

checking the direction of current flow through said components for each of said layers, and accepting said design when said current flow into and out of said components are in opposite directions.

12. The storage medium according to claim 6, further comprising the stored instructions of:

determining the relative distribution of contacts on a metallization layer of said integrated circuit with respect to said axes; and accepting said design only when said contacts have a symmetrical distribution about said axes.

13. The storage medium according to claim 6, further comprising the stored instructions of:

determining the spacing between each of said contacts; and accepting the design when said spacings between said contacts are substantially the same.

14. In a system for verifying the design of integrated circuits, a storage medium containing instructions for carrying out a method for evaluating the robustness of the design comprising:

identifying an ESD shape containing an ESD network on said integrated circuit;

identifying a first axis and centroid of a first level i;

measuring the first moment of shapes contained within said ESD shape in a second level j relative to said first level i;

determining a second moment of shapes contained within said ESD shape in said second level j relative to said first level i;

determining a third moment of shapes within said ESD shape in said second level j;

determining from said first, second and third moments the symmetry of said ESD shape; and accepting said design if said symmetry is within a specified degree.

15. The storage medium according to claim 14, further comprising the stored instructions of:

determining the first, second and third moments of shapes contained within said ESD shape for all of said levels of said integrated circuit;

determining for each of said levels the symmetry of said shapes in said level based on said first, second, and third moments; and accepting said design if said symmetry of each of said levels is within said specified degree.

16. The storage medium according to claim 14, further comprising the stored instructions of:

determining from computer data defining mask structures an ESD shape on a level of said integrated circuit;

determining for shapes contained within said ESD shape the degree of symmetry of said shapes with respect to first and second axes of said level; and accepting said design based upon said determination of said degree of symmetry.

17. The storage medium according to claim 14, further comprising the stored instruction of:

evaluating for each remaining level of said integrated circuit the respective symmetry of each of said shapes contained within an ESD shape; and accepting said design based on a determination of the symmetry of all of said levels.

* * * * *